United States Patent [19]
Kawauchi

[11] Patent Number: 5,522,133
[45] Date of Patent: Jun. 4, 1996

[54] COINING METHOD FOR BONDING PAD SURFACE

[75] Inventor: Takanobu Kawauchi, Kyoto, Japan

[73] Assignee: Rohm Co., Ltd, Kyoto, Japan

[21] Appl. No.: 243,365

[22] Filed: May 16, 1994

[30]      Foreign Application Priority Data

May 25, 1993   [JP]   Japan .................... 5-148517

[51] Int. Cl.⁶ .................................................. H01R 43/16
[52] U.S. Cl. ........................... 29/874; 174/94 R; 439/83
[58] Field of Search ........................ 29/874; 72/379.2, 72/414; 174/94 R, 52.4; 439/83

[56]              References Cited

U.S. PATENT DOCUMENTS 5,075,941   12/1991   Massironi ................................ 29/874
5,270,492   12/1993   Fukui ..................................... 174/52.4

FOREIGN PATENT DOCUMENTS 3-221277   9/1991   Japan .................................. 72/379.2

*Primary Examiner*—P. W. Echols
*Attorney, Agent, or Firm*—Brumbaugh, Graves Donohue & Raymond

[57]              ABSTRACT

The punching face of a punch for coining is set smaller than the bonding pad surface of a lead frame to which wire bonding is applied and coining is applied to only a portion necessary for the wire bonding to be effected on the bonding pad surface.

3 Claims, 3 Drawing Sheets 5,522,133

COINING METHOD FOR BONDING PAD SURFACE

BACKGROUND OF THE INVENTION

The present invention relates to a coining method for treating the bonding pad surface of a lead frame to which wire bonding is applied.

When electronic parts such as transistors, diodes and ICs are assembled, lead frames are generally used for providing leads as external terminals. For example, FIG. 5 illustrates a typical construction of lead frames in the case of a transistor. The lead frames 1 are usually produced by punching out of a metal sheet and those formed into a desired shape are electrically connected to electrodes provided on the surface of a semiconductor element 2. In this case, the electrode of the semiconductor element 2 and the bonding pad surface 1a of the lead frame 1 are normally connected by wire bonding using a wire 3 of aluminum, gold, copper or the like.

As the surface of such a lead frame 1 is coarse, the contact face (wire bonding face 3a) of the wire 3 may adhere incompletely or insecurely to the bonding pad surface 1a if the wire bonding is applied to the surface as it is. In other words, the contact face tends to become unstable, thus causing conduction failure or causing the wire bonding face to peel off. In order to ensure the wire bonding, coining has heretofore been employed, as shown in FIG. 6 and FIG. 7 (sectional view taken on line D—D of FIG. 6), so that before the wire bonding, a coining surface 14 is formed by squashing and smoothing (coining) the whole bonding pad surface 1a at a depth of, for example, $\underline{x}$=20 μm.

In a case where the lead frame 1 is formed into a desired shape by punching, however, there develops a curvature 9 on the punched face 1b as shown in FIG. 8. For lead frames made of similar material, the thicker the lead frame 1 becomes, the greater, the curvature 9 becomes. Moreover, a burr 5 is produced over the substantially whole peripheral edge of the lead frame 1 on the opposite side from the punched face 1b above. When, for example, the thickness of the lead frame 1 is 700 μm, the length $\underline{y}$ of the barr 5 amounts to about 30 μm.

When an attempt is therefore made to do the coining by pressing down the lead frame 1 held between a cradle 6 installed beneath the back surface (punched face 1b) of the bonding pad surface 1a and a vertically-movable coining punch 7 with the side that has developed the burr 5 as the bonding pad surface 1a as shown in FIG. 9, the burr 5 projecting from the substantially whole peripheral edge of the bonding pad surface 1a acts as a buffer for lessening the effect of the pressure applied by the coining punch 7 between a punching face 7a and the bonding pad surface 1a. Thus, if the burr 5 is bulky, the coining depth $\underline{x}$ may not become uniform or otherwise pieces of the squashed burr 5 remain between the punching face 7a and the bonding pad surface 1a in such a way as to surround the central part of the bonding pad surface 1a, thus causing the force of repulsion to act uniformly against the pressure applied by the punching face 7a. As a result, the punching face 7a may be unable to effect the coining properly on the bonding pad surface 1a, particularly in the central part thereof or unable to effect the coining entirely because a space is formed between the punching face 7a and the bonding pad surface 1a (coining surface 14). Therefore, the reliable formation of the smooth coining surface 14 has been difficult.

Even though an attempt is made, on the other hand, to use the punched face 1b of the lead frame 1 as the bonding pad surface 1a as shown in FIG. 10, the burr 5 also acts as a buffer for lessening the pressure applied by the punch 7 between the cradle 6 and the punch 7. Moreover, the curvature 9 of the punched face 1b may allow the application of coining to only a part of the bonding pad surface 1a and there is the possibility that the wire cannot be connected properly thereto in case the wire-bonding position shifts. That is, even if the punched face 1b is used as the bonding pad surface 1a like this, it is still difficult to ensure the sufficient coining.

If the coining pressure is increased more than necessary so as to ensure the sufficient coining in view of the foregoing problems, the pressure will be applied excessively to the boundary of the coining surface 14, which also causes problems to arise newly in that the strength of the lead frame 1 at the boundary may decrease or the lead frame itself may snap.

SUMMARY OF THE INVENTION

An object of the present invention made to solve the foregoing problems is to provide a coining method of treating the bonding pad surface of a lead frame so that wire bonding free from bad connection and the like can be made.

In view of the existing state of coining technique, the present inventor made an exhaustive study of solutions of the foregoing problems and found that by making a punching face for coining smaller than a bonding pad surface to which wire bonding is applied, and by applying the coining to only a portion of the bonding pad surface necessary for the wire bonding, the coining can be implemented satisfactorily.

The present invention is concerned with a coining method for making surface treatment by subjecting to coining the bonding pad surface of a lead frame formed into a desired shape by punching and more specifically a coining method for pressing and smoothing a part of the bonding pad surface including a wire bonding face.

Since the coining is conducted by pressing the punching face of a punch against a portion within a bonding pad region and yet excluding a burr on the peripheral edge of the bonding pad surface, the punching face does not contact the burr on the peripheral edge and the coining pressure applied to the punch is allowed to act on the coining surface totally and effectively. Therefore, a uniformly-smoothed surface becomes repeatedly obtainable.

DETAILED DESCRIPTION OF THE PREFERRED EMBODIMENTS

Preferred embodiments of the present invention will now be described. However, the present invention is not limited to these embodiments of the present invention.

Figure 1:
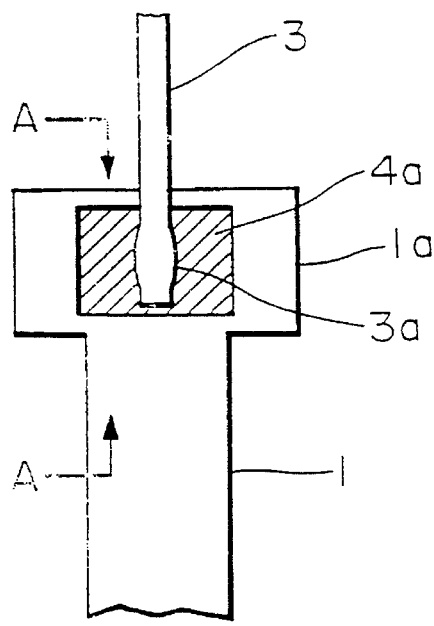
FIG. 1 is a top view of a coining surface of a bonding pad surface according to a first embodiment of the present invention.
Figure 2:
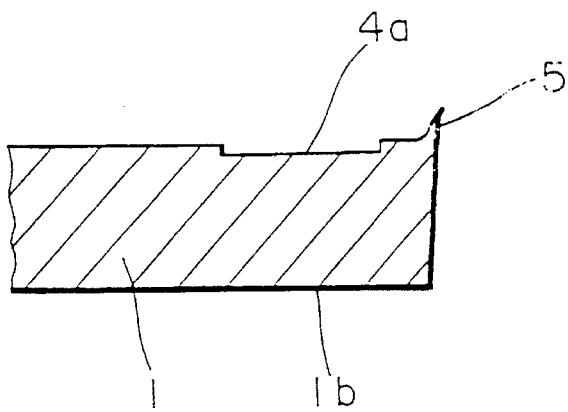
FIG. 2 is a sectional view taken on line A—A of FIG. 1.

FIGS. 1 and 2 illustrate a first embodiment of the present invention. As shown in FIG. 1, a coining surface 4a includes a wire bonding face 3a in a bonding pad surface 1a of a lead frame 1 formed by punching but excludes the peripheral edge portion of the bonding pad surface 1a.

According to the first embodiment of the present invention, coining is, as shown in FIG. 2, conducted on the opposite side of a punched face 1b, the former having a burr 5 projecting therefrom.

For the above coining, for example, a vertically-movable punch having a punching face smaller than the bonding pad surface 1a and capable of covering at least the wire bonding area of the lead frame 1 is pressed against the bonding pad surface of the lead frame 1 which is set on a fixed cradle placed opposite to the punch.

If the coining is conducted at the substantially central part of the bonding pad surface 1a as described above, it can be conducted without letting the punching face contact the burr 5 on the peripheral edge of the bonding pad surface 1a. The preset pressure is then applied by the punch to the coining surface 4a, so that a smooth surface having uniform depth is repeatedly obtainable through the coining. Therefore, the application of wire bonding to the surface thus obtained makes it possible to connect a wire 3 thereto excellently.

When the coining is conducted on the punched face 1b of the lead frame 1, for example, in the first embodiment, the cradle may be placed opposite to the punch in such a way that it is set free from the burr 5, that is, it abuts against the lead frame 1 on the inside of its peripheral edge.

Figure 3:
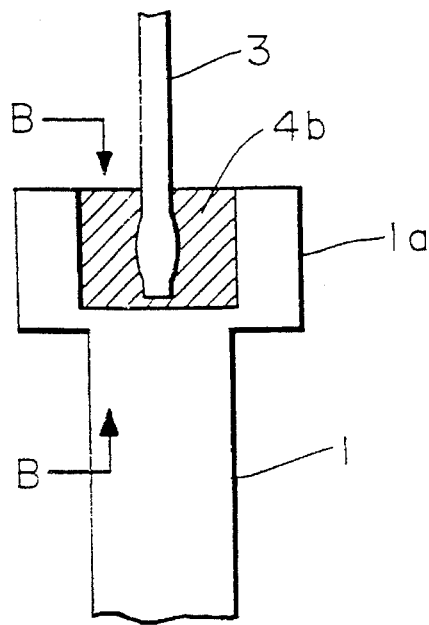
FIG. 3 is a top view of a coining surface of a bonding pad surface according to a second embodiment of the present invention.
Figure 4:
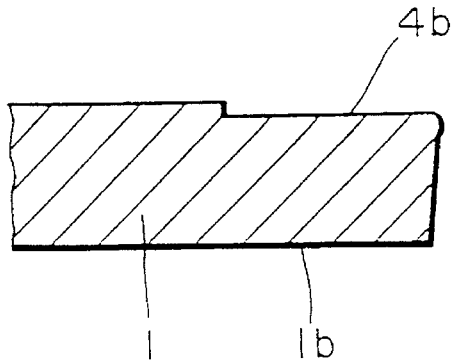
FIG. 4 is a sectional view taken on line B—B of FIG. 3.
Figure 5:
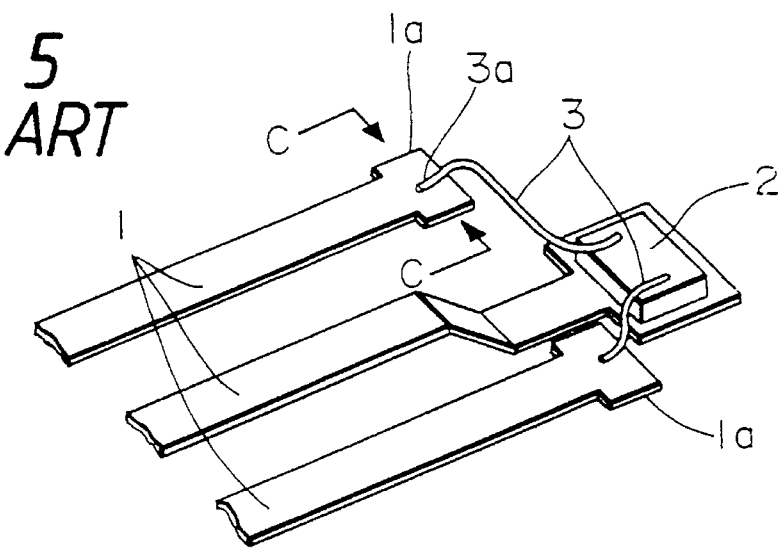
FIG. 5 is a perspective view of a transistor assembly illustrative of its construction.
Figure 6:
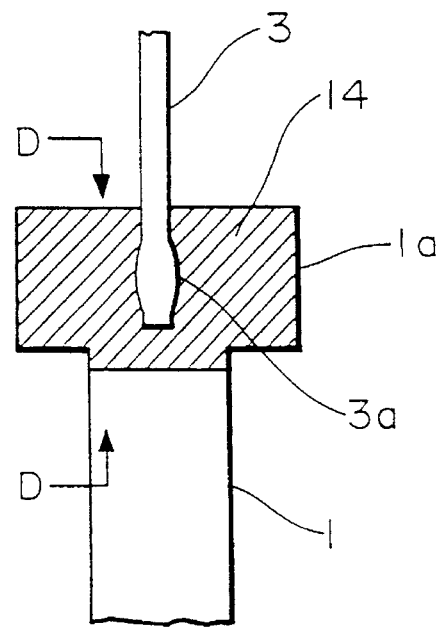
FIG. 6 is a top view of a coining surface of a conventional bonding pad surface.
Figure 7:
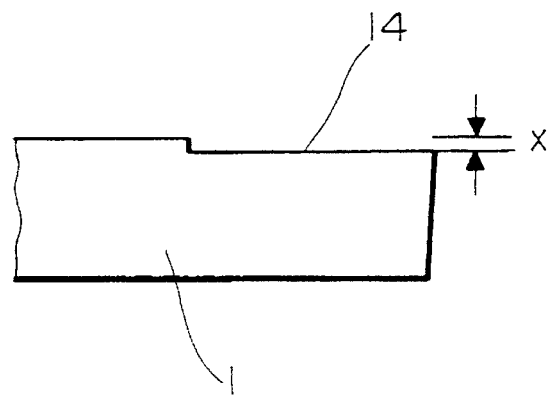
FIG. 7 is a sectional view taken on line D—D of FIG. 6.
Figure 8:
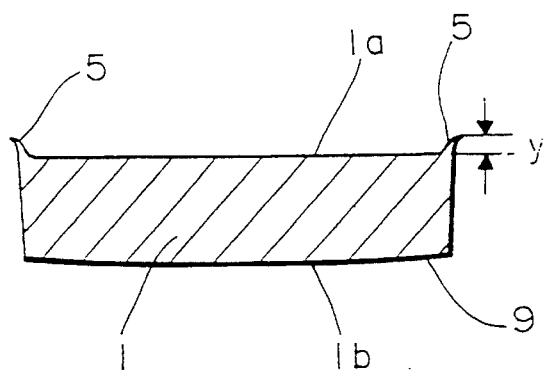
FIG. 8 is a sectional view taken on line C—C of FIG. 6, showing the configuration of the lead frame before being subjected to the coining.
Figure 9:
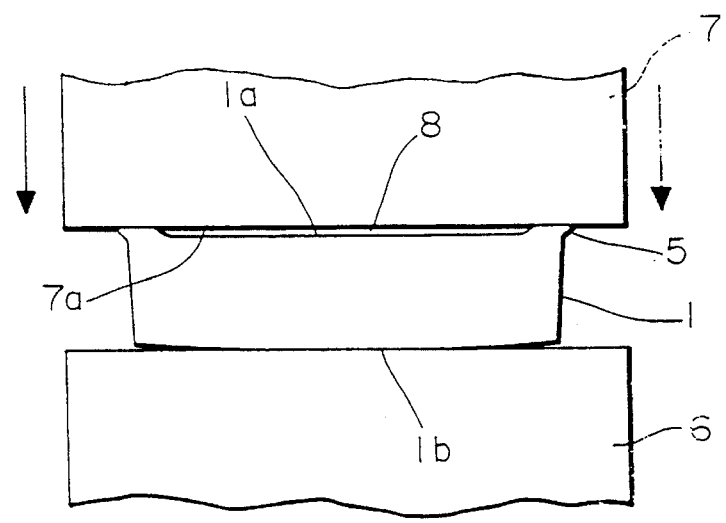
FIG. 9 is a sectional view of a lead frame being subjected to the coining in a conventional way.
Figure 10:
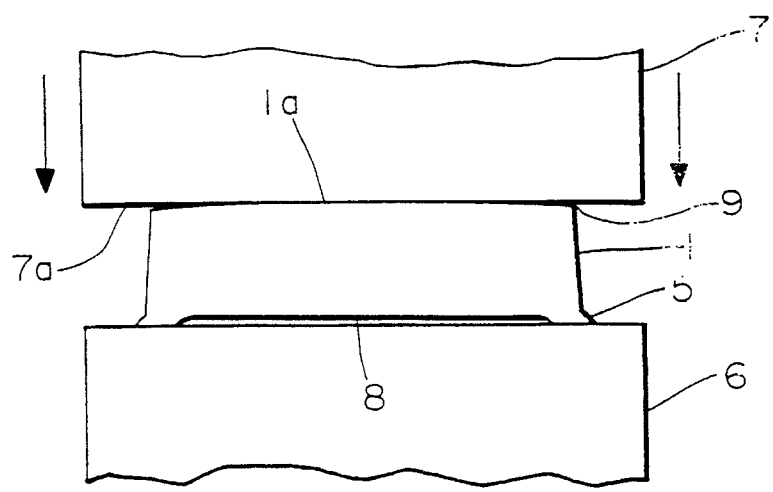
FIG. 10 is a sectional view of another lead frame being subjected to the coining in a conventional way.

FIGS. 3 and 4 illustrate a second embodiment of the present invention, wherein a coining surface 4b is provided in a part of the bonding pad surface 1a so as to include the leading peripheral edge of the bonding pad surface 1a. In this case, the lead frame 1 is so placed that the side opposite the punched face 1b is coined.

The coining according to the second embodiment of the present invention is carried out through the steps of, for example, placing the lead frame 1 on the cradle capable of holding at least the bonding pad area of the lead frame, and pressing a part of the the bonding pad surface 1a including a peripheral edge at a predetermined position by means of a punch having a punching face equal to that of the punch according to the first embodiment of the present invention or a punching face which is longitudinally longer.

Since the burr 5 on the peripheral edge of the bonding pad surface 1a being subjected to the coining then eccentrically abuts against one side of the punching face of the punch, the burr 5 which is arched upward and projected outward from the peripheral edge of the bonding pad surface 1a is caused to escape outside the peripheral edge of the bonding pad surface 1a conveniently, whereby the reliable coining can be achieved as in the case of the first embodiment of the present invention. Therefore, the wire 3 is properly connected by applying wire bonding to the surface thus obtained through the coining and even though the wire contacts the peripheral edge of the bonding pad surface 1a, it will hardly be disconnected because the burr 5, which otherwise crosses the wire 3 in a plane, has been removed.

When the coining is applied to the punched face 1b of the lead frame 1 in the second embodiment of the present invention, moreover, it may be effected by placing a cradle having a support face similar in configuration to the punching face of the punch or slightly greater than that of the punch so that the cradle is positioned opposite to the punch in such a way that it is free from any burr 5 on the peripheral edge other than that of the bonding pad surface 1a around which the burr 5 to be squashed exists.

As set forth above, according to the present invention, a surface which has uniform depth and is satisfactorily smooth can surely be formed, irrespective of the burr condition on the periphery of the bonding pad surface. Therefore, the wire bonding made on the coining surface thus obtained offers an excellent wired condition, thus greatly improving the reliability of finished products.

Since the coining is partially applied to the bonding pad surface, further, the strength of the frame on the boundary of the surface obtained through the coining is not reduced, whereby the lead frame is prevented from becoming bent or disconnected.

What is claimed is:

1. A coining method for pressing and surface-treating a bonding pad surface of a lead frame comprising forming a lead frame into a desired shape by punching to provide a bonding pad surface and coining a part of said bonding pad surface which is smaller than the bonding pad surface to provide a wire bonding portion.

2. A coining method as claimed in claim 1, wherein said part including said wire bonding portion excludes peripheral edge portions of said bonding pad surface.

3. A coining method as claimed in claim 1, wherein said part including said wire bonding portion includes a part of a peripheral edge portion of said bonding pad surface.

* * * * *